(12) United States Patent
Palme et al.

(10) Patent No.: US 10,928,436 B2
(45) Date of Patent: Feb. 23, 2021

(54) EVALUATION OF PHASE-RESOLVED PARTIAL DISCHARGE

(71) Applicant: General Electric Company, Schenectady, NY (US)

(72) Inventors: Jan Thomas Palme, Baden (CH); Maximilian Hobelsberger, Wurenlingen (CH)

(73) Assignee: General Electric Company, Schenectady, NY (US)

(*) Notice: Subject to any disclaimer, the term of this patent is extended or adjusted under 35 U.S.C. 154(b) by 354 days.

(21) Appl. No.: 15/419,777

(22) Filed: Jan. 30, 2017

(65) Prior Publication Data

US 2018/0217198 A1    Aug. 2, 2018

(51) Int. Cl.
*G01R 31/12*    (2020.01)

(52) U.S. Cl.
CPC ...... *G01R 31/1263* (2013.01); *G01R 31/1272* (2013.01)

(58) Field of Classification Search
CPC ...... G01N 27/20; G01N 27/205; G01N 27/92; G01R 31/02; G01R 31/021; G01R 31/024; G01R 31/025; G01R 31/06; G01R 31/08; G01R 31/083; G01R 31/086; G01R 31/12; G01R 31/1227; G01R 31/1263; G01R 31/1272; G01R 31/34; G01R 31/343; G01R 31/346
USPC ......... 324/76.12, 76.13, 76.19, 76.21, 76.22, 324/509, 522, 535, 536, 537, 541, 544, 324/547, 551, 557, 765.01; 702/57, 58, 702/59, 66, 72, 76, 81, 82, 179, 182, 183, 702/185, 196
See application file for complete search history.

(56) References Cited

U.S. PATENT DOCUMENTS

| | | | |
|---|---|---|---|
| 5,917,316 A * | 6/1999 | Bosco | G01R 15/181 324/126 |
| 6,088,658 A * | 7/2000 | Yazici | G01R 31/1272 702/180 |
| 6,446,027 B1 * | 9/2002 | O'Keeffe | G01R 31/02 702/183 |
| 9,976,989 B2 * | 5/2018 | Dehghan Niri | G06N 20/00 |
| 10,379,151 B2 * | 8/2019 | Daoudi | G06T 7/001 |

(Continued)

*Primary Examiner* — Steven L Yeninas
(74) *Attorney, Agent, or Firm* — Eversheds Sutherland (US) LLP

(57) ABSTRACT

Embodiments of the disclosure are to evaluation of a phase-resolved partial electrical discharge (PD) of equipment insulation. In one embodiment, a method includes providing Phiqn-arrays by a measurement device configured to detect a PD process in electrical equipment. The electrical equipment can include high voltage insulation. The method further includes associating, by an equipment controller communicatively coupled to the measurement device, at least one Phiqn-pattern present in the Phiqn-arrays with a geometrical shape. The method also includes tracking, by the equipment controller, parameters of the geometrical shape in the Phiqn-arrays. The method also includes determining, by the equipment controller and based on the parameters of the geometrical shape, a discharge intensity associated with the Phiqn-pattern. The method may further include providing, by the equipment controller and based on the discharge intensity, a signal indicative of a condition of the high voltage insulation.

20 Claims, 6 Drawing Sheets

(56) References Cited

U.S. PATENT DOCUMENTS

| | | | |
|---|---|---|---|
| 10,571,504 B2* | 2/2020 | Lee | G01R 29/26 |
| 2004/0204873 A1* | 10/2004 | Freisleben | G01R 31/1272 |
| | | | 702/57 |
| 2005/0012507 A1* | 1/2005 | Kaneda | G01R 31/343 |
| | | | 324/536 |
| 2008/0088314 A1* | 4/2008 | Younsi | G01R 31/1227 |
| | | | 324/457 |
| 2009/0119035 A1* | 5/2009 | Younsi | G01R 31/1227 |
| | | | 702/58 |
| 2012/0095710 A1* | 4/2012 | Bettio | G01R 31/1227 |
| | | | 702/65 |
| 2012/0330871 A1* | 12/2012 | Asiri | G01R 31/343 |
| | | | 706/25 |
| 2013/0218491 A1* | 8/2013 | Wei | G01R 31/42 |
| | | | 702/58 |
| 2014/0340096 A1* | 11/2014 | Rudolph | G01R 31/1254 |
| | | | 324/536 |
| 2016/0209459 A1* | 7/2016 | Tozzi | G01R 31/1227 |
| 2016/0274176 A1* | 9/2016 | Di Stefano | G01R 31/1227 |

\* cited by examiner

EVALUATION OF PHASE-RESOLVED PARTIAL DISCHARGE

TECHNICAL FIELD

The disclosure relates to diagnostics of high power electrical equipment, and, more specifically, to evaluation of phase-resolved partial electrical discharge of equipment insulation.

BACKGROUND

High-voltage insulation is widely used in electrical conductors of high power electrical equipment, such as high-voltage electrical generators, transformers, electrical motors, and so forth. The integrity of the insulation may need to be tested and assessed to prevent costly breakdowns of both the insulation and equipment being insulated. In many cases, a breakdown in insulation during operation may lead to serious damage or even complete destruction of high power electrical equipment. As a result, electrical breakdowns in insulation can lead to costly outage time of the high power electrical equipment.

There exist several conventional methods of assessing condition of insulation states. However, most of the conventional methods require taking the equipment being diagnosed "offline." This means that the equipment cannot be operated while its condition is being assessed. There are some methods allowing assessing condition of insulation "online," while the equipment is in operation. Most such "online" methods include evaluation of characteristics of high frequency signals generated when the insulation is exposed to high voltages. These high frequency signals can be produced by individual partial discharge (PD) associated with insulation imperfections.

One conventional method for evaluation of detected high voltage pulses includes phase-resolved PD analysis. The phase-resolved PD analysis can result in a "Phiqn-array" (also referred to as Phiqn-matrix). Phiqn-images (also referred to as PD-images) can be obtained using the Phiqn-arrays. The Phiqn-images are graphical representations of the Phiqn-arrays. Typically, a trained specialist can analyze the Phiqn-images to assess the condition of the insulation.

One of the shortcomings of the conventional PD analysis by a trained specialist is lack of concurrency between taking measurements and assessments of the condition of the insulation. Furthermore, such analysis typically occurs periodically, for example only once or twice a year. Thus, significant deterioration of the insulation can remain unnoticed between the times measurements are taken.

Other shortcomings of known methods for PD analysis include lack of noise immunity, reliability of warnings, and, especially, the ability to distinguish between different Phiqn-patterns in Phiqn-arrays.

BRIEF DESCRIPTION OF THE DISCLOSURE

This disclosure relates to systems and methods for evaluation of phase-resolved partial electrical discharge of equipment insulation. Certain embodiments of the disclosure relate to monitoring, analyzing, assessing, and tracking trends associated with phase-resolved Phiqn-arrays and Phiqn-patterns. Certain embodiments of the disclosure can also facilitate monitoring insulation in high voltage power electrical equipment in order to provide early warnings and alerts concerning condition of the insulation.

According to one embodiment of the disclosure, a system for evaluation of a phase-resolved partial discharge is provided. The system may include a measurement device configured to detect at least one PD process in the high voltage insulation of an electrical equipment and provide a plurality of Phiqn-arrays. The system may further include an equipment controller communicatively coupled to the measurement device. The equipment controller can be configured to associate at least one Phiqn-pattern present in the Phiqn-arrays with a geometrical shape. The equipment controller can be further configured to track parameters of the geometrical shape in the plurality of the Phiqn-arrays. The equipment controller can be further configured to determine, based on the parameters of the geometrical shape, a discharge intensity associated with the PD pattern. The equipment controller can be configured to provide, based on the discharge intensity, a signal indicative of an insulation quality of the high voltage insulation.

In some embodiments of the disclosure, the equipment controller configured to associate the at least one Phiqn-pattern with a geometrical shape may be further configured to determine a type, a location, and dimensions of the geometrical shape in order to fit the Phiqn-pattern.

In some embodiments of the disclosure, the equipment controller configured to track the parameters of the geometrical shape can be further configured to track changes in the location and dimensions of the geometrical shape. In certain embodiments of the disclosure, the geometrical shape is associated with a type of partial discharge process.

In some embodiments of the disclosure, the geometrical shape can be selected from a list including at least one of the following: a triangle, a horizontal rectangle, a vertical rectangle, and an oval.

In some embodiments of the disclosure, the equipment controller configured to determine the discharge intensity can be further configured to determine the discharge intensity based on high-frequency pulses located within the geometrical shape associated with at least one Phiqn-pattern.

In some embodiments of the disclosure, the equipment controller configured to associate the at least one Phiqn-pattern with the geometrical shape can be further configured to utilize a learning algorithm in order to associate the Phiqn-pattern with the geometrical shape.

In some embodiments of the disclosure, the learning algorithm is trained with historical Phiqn-arrays and previous Phiqn-patterns identified in the historical Phiqn-arrays.

In some embodiments of the disclosure, the equipment controller is further configured to determine, based on the discharge intensity, a rate of deterioration of the high voltage insulation.

In some embodiments of the disclosure, the parameters of the geometrical shape can be correlated to operational parameters of the electrical equipment and/or ambient conditions. In certain embodiments of the disclosure, the equipment controller can be further configured to modify, based on the correlation, the signal indicative of a condition of the high voltage insulation.

In some embodiments of the disclosure, the equipment controller can be further configured to determine, based on operational parameters of the electrical equipment and/or ambient conditions, a threshold for the discharge intensity. The equipment controller can be further configured to determine that the discharge intensity exceeds the threshold, and based on the determination, selectively provide the alert concerning the insulation quality.

According to another embodiment of the disclosure, a method for evaluation of a phase-resolved partial discharge is provided. The method may include providing, by a measurement device, one or more Phiqn-arrays. The measurement device can be configured to detect at least one partial discharge process in an electrical equipment. The electrical equipment may include high voltage insulation. The method may further include associating, by an equipment controller communicatively coupled to the measurement device, at least one Phiqn-pattern present in the one or more Phiqn-arrays with a geometrical shape. The method may further include tracking, by the equipment controller, parameters of the geometrical shape in the Phiqn-arrays. The method may further include determining, by the equipment controller and based on the parameters of the geometrical shape, a discharge intensity associated with the at least one Phiqn-pattern. The method may further include providing, by the equipment controller and based on the discharge intensity, a signal indicative of an insulation quality of the high voltage insulation.

Other embodiments, systems, methods, features, and aspects will become apparent from the following description taken in conjunction with the following drawings.

DETAILED DESCRIPTION

Certain embodiments of the disclosure can include systems and methods for evaluation of phase-resolved partial discharge measurements. The disclosed systems and methods may provide continuous analysis and monitoring of discharge activities in insulation of high voltage electrical equipment. Some embodiments of the disclosure can facilitate alarms concerning failures of the insulation when specific discharge activities exceed threshold levels.

In some example embodiments of the disclosure, a method for evaluation of a phase-resolved partial discharge measurement may include providing, by a measurement device, one or more Phiqn-arrays. The measurement device can be configured to detect at least one partial discharge process in electrical equipment. The electrical equipment may include high voltage insulation. The method may further include associating, with a geometrical shape, by an equipment controller communicatively coupled to the measurement device, at least one Phiqn-pattern present in the one or more Phiqn-arrays. The method may further include tracking, by the equipment controller, parameters the geometrical shape in the PD images. The method may further include determining, by the equipment controller and based on the parameters of the geometrical shape, a discharge intensity associated with the at least one PD pattern. The method may further include providing, by the equipment controller and based on the discharge intensity, a signal indicative of a condition of the high voltage insulation.

Technical effects of certain embodiments of the disclosure can include performing a continuous diagnostic of insulation in high voltage electrical equipment during operation of the equipment. Furthermore, technical effects of certain embodiments of the disclosure can provide reliable state assessment of the insulation. Yet further technical effects of certain embodiments of the disclosure can facilitate prevention of unexpected outages of the electrical equipment and increased quality of service of the electrical equipment.

The following provides a detailed description of various example embodiments related to systems and methods for evaluation of a phase-resolved partial discharge measurement.

Figure 1:
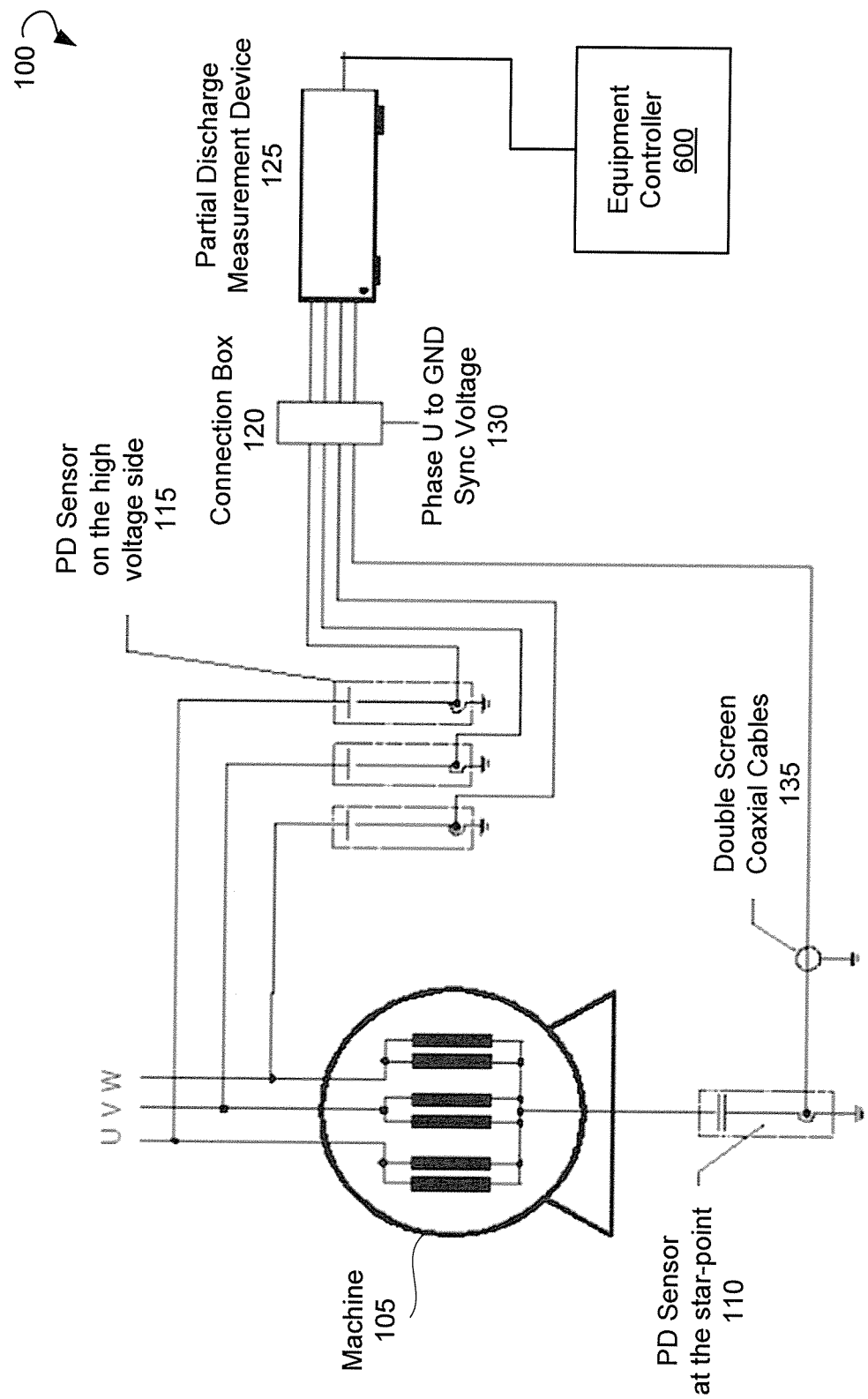
FIG. 1 is a block diagram illustrating an example system for evaluation of a phase-resolved partial discharge, according to certain embodiments of the disclosure.

Turning now to the drawings, FIG. 1 is a block diagram illustrating an example PD evaluation system 100, which can be used to practice methods for evaluation of a phase-resolved partial discharge, in accordance with certain embodiments of the disclosure. The system 100 may include a machine 105, a PD sensor 110 at a star-point, double screened coaxial cables 135, PD sensors 115 on a high voltage side, a connection box 120, a partial discharge device 125, and an equipment controller 600.

In various embodiments of the disclosure, the machine 105 may include a transformer, an electrical motor, a high power electrical generator which can be used, for example in power plants, and so forth. The machine 105 may include high-voltage insulation for electrical conductors (also referred to as an insulation system). When exposed to high voltages, the insulation system may experience one or more PD processes. A PD process can be defined as a PD activity of a certain type found at a certain location of the machine. The PD processes may occur inside the insulation, on a surface of the insulation, between a surface of the insulation and an adjacent part of the machine, and across gas-filled gaps between conducting or non-conducting bodies outside of the insulation area. Different locations of PD activities may determine different types of PD processes due to different discharge mechanisms involved. Examples of well-known typical discharge processes may include, but not limited to, inner discharge processes, surface discharge processes, delamination discharge processes (for example, an inner delamination or a delamination between insulation and copper conductor), slot discharge processes, and gap discharge processes. During the PD processes, the discharges can produce characteristic high-frequency signals. Some other processes, such as vibration sparking or a slip ring sparking may occur independently or simultaneously with the PD processes and may also cause the high-frequency signals. The high-frequency signals can be detected at the three phase connections of the machine 105 by PD sensors 115 and at star-point by sensor 110 and forwarded to a measurement instrument (for example, the partial discharge device 125). The measurement instrument may resolve the high-frequency signals into individual discharge pulses. A sequence of the detected pulses can be further processed by device 125 and/or equipment controller 600 to determine characteristics of the detected pulses.

In some embodiments of the disclosure, processing of the detected pulses may include phase-resolved partial discharge analysis. In a time domain, the pulses can be categorized with respect to phase angles of occurrences of pulses, which is a time of occurrence (or a phase angle) within a full period (or 360 degrees—phase angle) of the alternative current (AC) phase voltage. The time of occurrence or the phase angle can be determined with respect to a synchronization signal. The synchronization signal may include a zero-crossing of AC voltage 130 from one of the three AC phases. In an amplitude domain, the pulses can be categorized by peak values (pulse heights) (for example, peak voltages). Each pulse can be categorized by a phase angle and a peak voltage and can be represented as a vector with a component (e.g., phase angle and peak value). In some embodiments of the disclosure, the process of detection of pulses may be performed for a certain time period (for example, 60 seconds).

In certain embodiments of the disclosure, results of the measurement can be collected using a plane in which a phase-angle forms an X-axis and a peak-voltage forms a Y-axis. The X-axis can stretch from about 0-360 degrees and Y-axis can stretch from about 0 to a maximum measurement range (max_range). The plain can be subdivided into cells with equal dimensions. For example, cell dimensions can include about 1 degree in the horizontal width and max_range/300 in the vertical height. All of the pulses falling into a certain cell of a phase-angle and a peak-value can be counted over a period, for example, 60 seconds. After 60 seconds of measuring and counting the number of detected pulses for each cell, a third dimension of the measurement result can be provided. The third dimension may indicate the number of pulses counted. The measurement result, which is also referred to as Phiqn-array, can be presented as a graphical image (referred to as a Phiqn-image or a PD image), in which the individual pixels represent the number of counted pulses indicated in the respective cell by a color or shape. The horizontal axis (x-axis) of the image can span the range of phase angles, from 0 about degree to 360 degrees, and the vertical axis (y-axis) can span a range of pulse-height (or an apparent charge). The color of the pixel is the number of pulses counted at the level of the pulse-height (or an apparent charge).

In various embodiments of the disclosure, the Phiqn-arrays may include specific Phiqn-patterns. The Phiqn patterns and graphical representations of the Phiqn-patterns can be distinguishable from each other because the Phiqn-patterns can be produced by different types of discharge processes in the insulation system. The Phiqn-patterns can be analyzed to assess the state of the insulation system. Analyzing the Phiqn-pattern can be complicated by that fact that specific patterns can become superimposed on each other. Additionally, the Phiqn-patterns can be superimposed with noise signals.

An Example Basic Approach for PD Evaluation

Certain embodiments of the current disclosure can be based on the following factors concerning Phiqn-patterns:

1) Different Phiqn patterns, which are characteristic of different types of PD processes, can be associated with different distinguishable types of basic geometrical shapes using a graphical representation of the Phiqn-pattern. Similar to letters in an alphabet, the basic shapes can be distinguished from each other, despite differences in size, proportions, and locations. In various embodiments of the disclosure, these basic shapes can be readily recognized by software applications (for example, by pattern recognition software, optical character recognition software, or other similar software) using specific algorithms for recognition of shapes.

2) Automatic recognition of the basic shapes can be difficult because different Phiqn-patterns generated by different PD processes can become superimposed on each other. The superimposition of a Phiqn-pattern may also impede and disturb the pulse detection process of the measurement instrument, thereby producing a certain alteration of the Phiqn-patterns, which may further complicate identification of different patterns and sources.

In some embodiments of the disclosure, solutions for recognition and differentiation of superimposed Phiqn-patterns can be based on the fact that individual discharge pulse sources and other pulse-sources in the electrical machine (e.g., a generator, a motor, and a transformer), that is different discharge processes occurring in the machine, may change their characteristics differently. Hence, different Phiqn-patterns produced by different discharge processes change with a different rate and in a different way. For example, characteristics of some discharge processes may change faster over time than characteristics of other discharge processes. Some discharge processes may depend on changes of gas pressure more than other discharge processes. These characteristics may include a pulse density (i.e. number of pulses per time-unit), pulse height, pulse-height distribution, and so forth. The characteristics of discharge processes can change slowly or quickly in response to changes of ambient parameters (for example, a temperature of an insulation material, a temperature of a conductor, a cooling gas temperature, a humidity, vibrations, a density, and pressure). The characteristics can change due to, for example, changes in the mean collision distance for electrons in a gas, changes of gap distances, and hence changes of field strength in the gas.

In some embodiments of the disclosure, it can be assumed that already existing discharge processes and the Phiqn-patterns produced by the existing discharge processes are invariant in the sense that the Phiqn-patterns do not change if the environment parameters influencing these discharge sources remain substantially the same.

3) In some embodiments of the disclosure, the Phiqn-pattern recognition and identification of PD process can be further based on the fact that different types of discharge processes (e.g., associated with gap-discharge sources, slot-discharge sources, surface-discharge sources, inner-discharge sources, delamination-discharge sources, inter-phase discharge sources, and so forth) may have different dependencies on ambient parameters. As a result, different Phiqn-patterns from different processes may disappear, change, and re-appear over time in different ways, independently of each other. The different Phiqn-patterns may change slowly in the discharge magnitude (pulse height) and/or intensity (pulse frequency), which corresponds to change of a position of the detected discharge in the vertical direction of the Phiqn-arrays (pulse height axis). In some Phiqn-arrays, the different Phiqn-patterns may be superimposed on each other. In other Phiqn-arrays generated at other times, the Phiqn-patterns may not be superimposed and can be separated and visible more clearly and hence more easily detectable.

In some embodiments of the disclosure, because changes in ambient parameters are not sudden and typically occur slowly over time, individual Phiqn-patterns produced by individual PD processes can be tracked by appropriate software methods. A precondition for tracking is that the Phiqn-patterns and Phiqn-arrays can be acquired at a sufficiently high timely repetition rate. In certain embodiments, a typical value for the acquisition repetition rate can be about 5 minutes. This means that every 5 minutes a new set of Phiqn-arrays based on signals received from PD sensors 110 and 115 of the machine 105 (for example, from three phase couplers of a generator) is produced. In comparison, conventional PD detection systems' rate of acquisition is typically only once a day.

In some embodiments of the disclosure, a Phiqn-pattern tracking and PD process tracking relies on a basic probabilistic assumption that a certain Phiqn-pattern, identified by its corresponding basic geometrical shape in a newly acquired Phiqn-array and corresponding graphic PD image, may stem from the same discharge process as a similar Phiqn-pattern acquired in a sequence of earlier acquisitions. This assumption can be derived from the physics of a system on which the PD process is detected. This assumption holds true also for the case of superimposed Phiqn-patterns, where the individual parts or components of the overall Phiqn-pattern and corresponding PD image can be identified and separated based on the sequence of earlier, historical Phiqn-arrays, and previous identifications of individual basic shapes attributed to individual PD processes.

Figure 2:
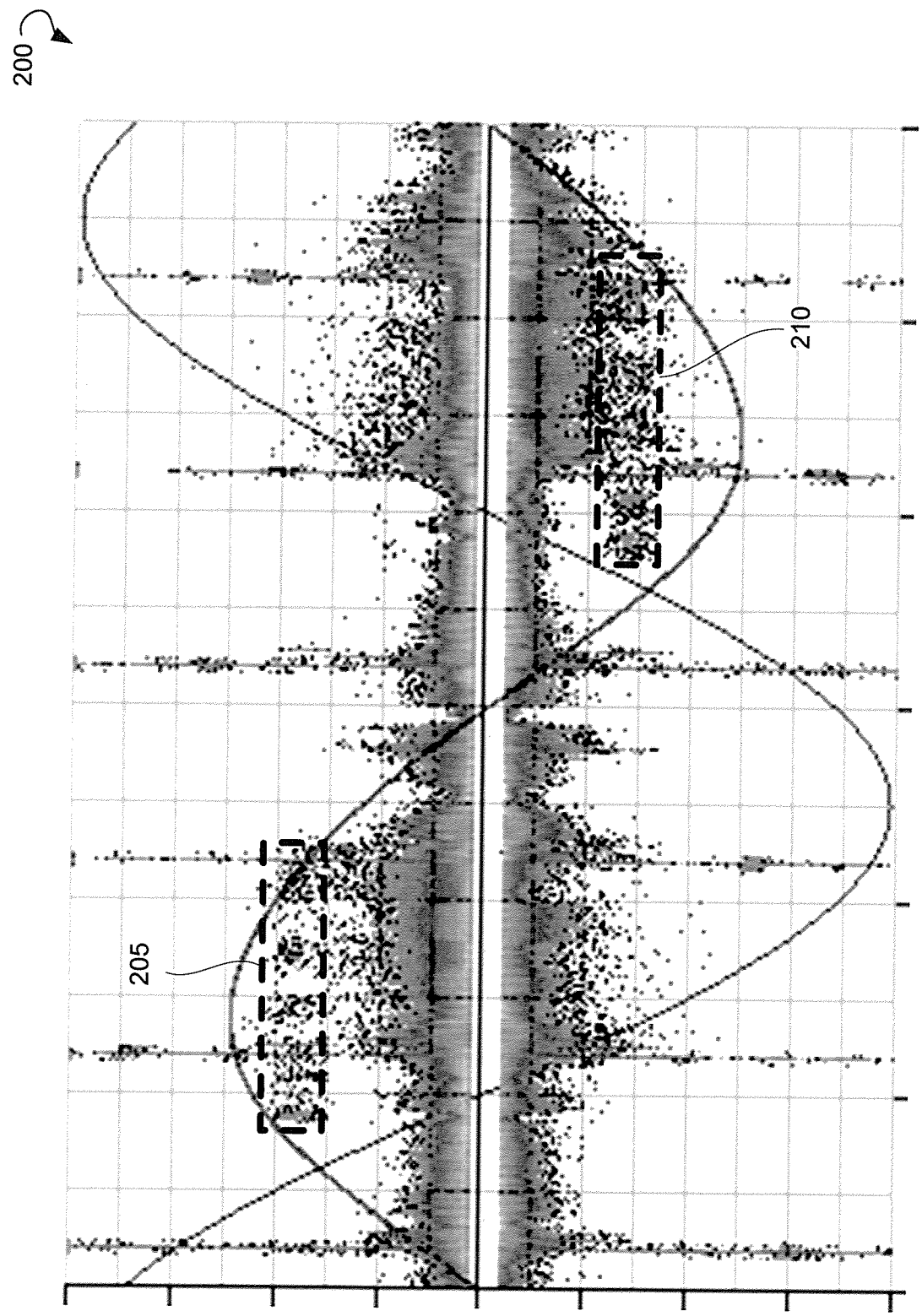
FIGS. 2-4 are example plots of images representing partial discharge (PD) arrays images according to embodiments of the disclosure.
Figure 3:
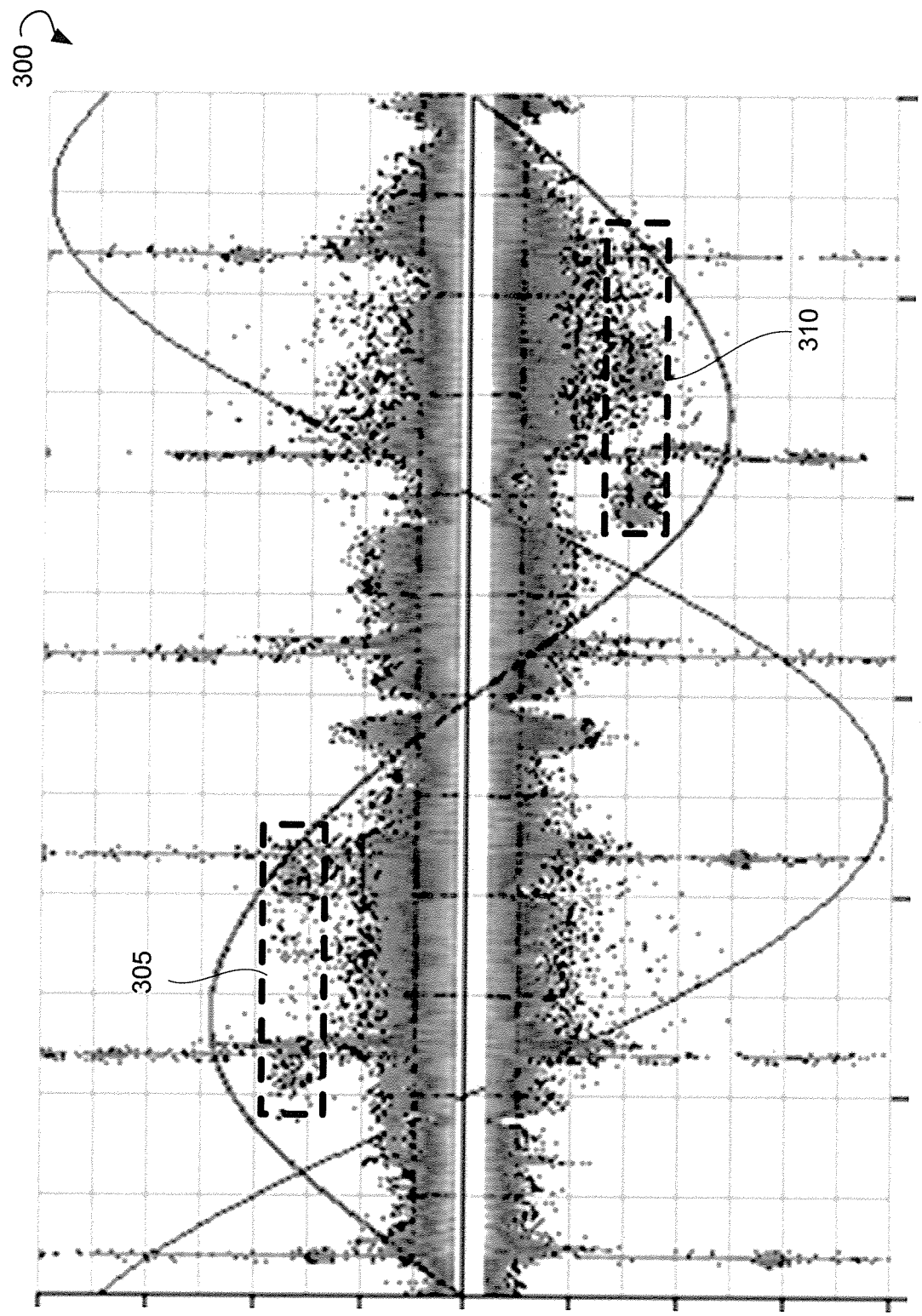

An example of a sequence of PD images, based on a sequence of Phiqn-arrays, is shown in FIG. 2 and FIG. 3. FIG. 2 shows an example PD image 200. The PD image 200 includes an image representation of Phiqn-pattern 205 and an image representation of Phiqn-pattern 210. The Phiqn-patterns 205 and 210 in PD image 200 can be identified based on the resemblance to a basic shape (a horizontal rectangle) and certain rules which pertain to this basic shape and its discharge mechanism (namely, a gap discharge).

FIG. 3 shows an example PD image 300. The PD image 300 may follow the PD image 200 in a sequence of images of Phiqn-arrays. The PD image 300 can include a Phiqn-pattern 305 and a Phiqn-pattern 310. Phiqn-patterns 305 and 310 can be different from the basic shapes corresponding to a gas discharge. However, because of the knowledge of the whole sequence of historical Phiqn-arrays, leading from Phiqn-pattern 200 of FIG. 2 to the later Phiqn-pattern 300 of FIG. 4, the Phiqn-patterns 305 and 310 can be identified again as being caused by an already known process that is the gap discharge process shown in FIG. 2. Without knowledge of the historical sequence of Phiqn-arrays, acquired with a short time interval, the interpretation of Phiqn-patterns may be quite different and/or dubious. The knowledge of features of Phiqn-patterns can be acquired by a process of learning of a PD evaluation system.

In some embodiments of the disclosure, during a learning process, Phiqn-patterns in newly acquired Phiqn-arrays can be identified based on learned features of the Phiqn-arrays. An again identified Phiqn-pattern in the newest image may reinforce the learning effect. On the other hand, a certain Phiqn-pattern that does not re-appear in the sequence of Phiqn-arrays over a long time may be "forgotten" by the PD evaluation system.

Figure 4:
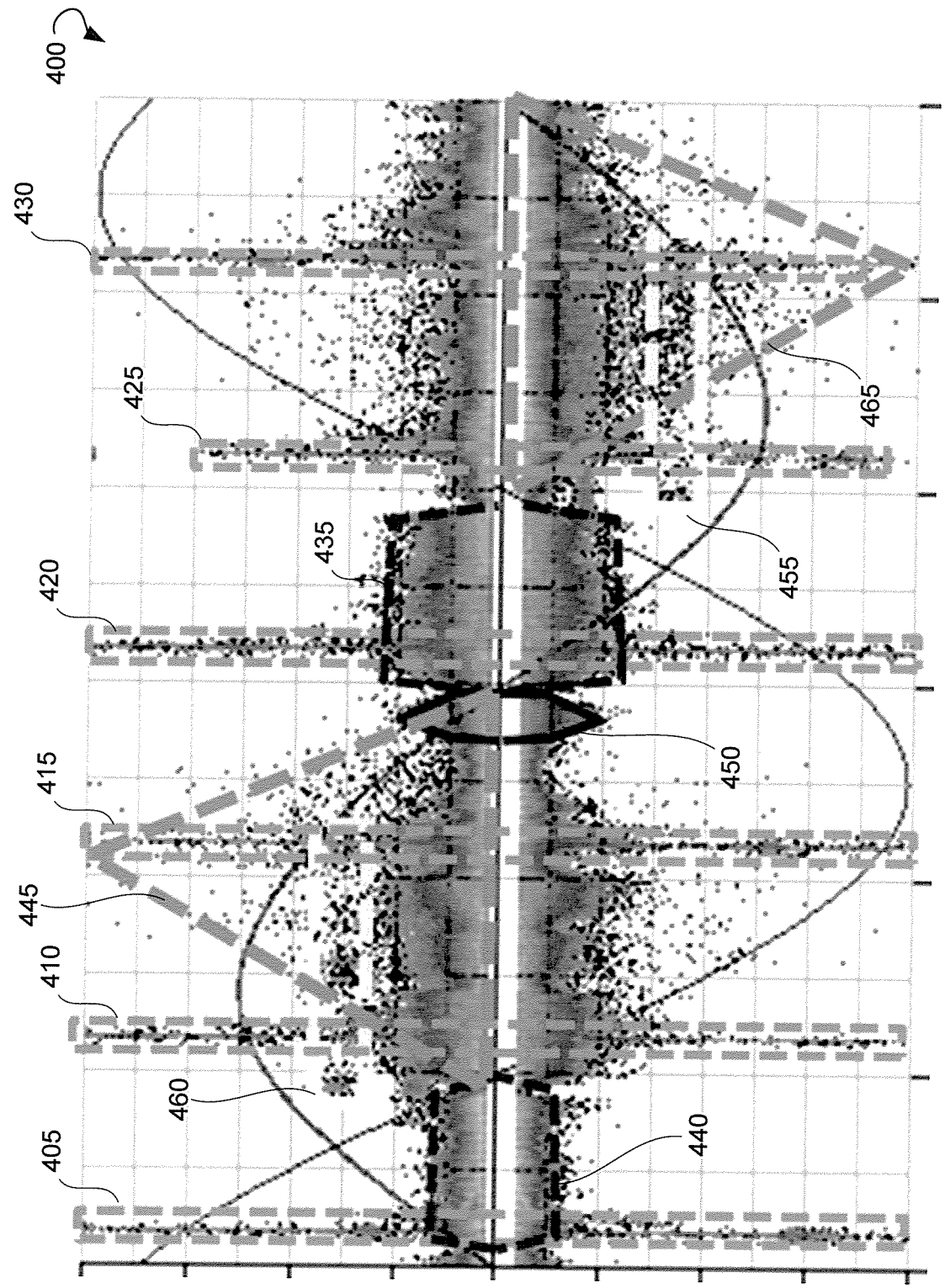

FIG. 4 is another example of a typical partial-discharge image 400, with a plurality of identified basic shapes indicating a plurality of different PD processes associated with different discharge sources, discharge types, and pulse sources. The basic geometrical shapes may include vertical rectangles 405, 410, 415, 420, 425, and 430, ovals 435, 440, 450, triangles 445 and 465, and horizontal rectangles 455 and 460. In some embodiments, the basic geometrical shapes may include different free form objects.

In some embodiments of the disclosure, trends in the identified PD discharge patterns and PD processes can be tracked in a sequence of Phiqn-arrays. After the individual Phiqn-patterns produced by the individual discharge processes have been identified, based on basic shapes and historical Phiqn-arrays, and basic shapes have been attributed to the Phiqn-patterns, the discharge activity within the basic shapes can be quantified. The basic quantification may include evaluating "characteristic values" including a pulse repetition rate, an average discharge current, a quadratic discharge rate (quadratic current), and the like, of all the pulses within the basic shapes. In some embodiments, the characteristic can be defined by standard IEC 60270. Every identified Phiqn-pattern in every acquired Phiqn-array can be attributed with one or more quantification numbers (for example, quadratic currents). The trends in the quantification numbers can be tracked over time. In certain embodiments, the quantification numbers can be stored in memory with a time tag. The equipment controller can be configured to display trends on a graphic screen. For example, the trends of a quadratic discharge current of an identified slot-discharge process at phase U can be displayed over time.

In further embodiments of the disclosure, the trends can be tracked relative to ambient parameters including coil temperatures, gas pressure and temperature, and gas humidity. As an example, the equipment controller may be configured to track trends showing development of slot discharges over time, where the slot discharges occur in the same gas pressure range.

In some embodiments of the disclosure, the trends can be used for generation of warnings. For example, the equipment controller can be configured to issue a warning if a characteristic, quantifying value (for example, quadratic current) of a certain identified process of a certain discharge-type (for example, a slot discharge) exceeds a pre-defined limit. In some embodiments, the pre-defined limit may include an absolute limit for the entire range of the ambient parameters. In other embodiments, the pre-defined limit may be selected based on temperature ranges.

In some embodiments of the disclosure, the equipment controller may be further configured to generate signals, warnings and alerts based, additionally, on relevant machine parameters and/or relevant ambient parameters.

In some embodiments of the disclosure, the equipment controller may be configured to generate a compressed version of the sequence of Phiqn-arrays and corresponding PD images. The compressed version of the sequence of Phiqn-arrays may include only Phiqn-arrays in which significant changes of PD-patterns have occurred as compared to the previous Phiqn-arrays in the sequence. The compressed version of the sequence of Phiqn-arrays can be stored for later analysis. The sequence of Phiqn-arrays can be compressed to reduce the overall size in consumed memory space, as the Phiqn-arrays can be acquired at a high rate.

Extension of the Approach for PD Evaluation

The coil of the electrical machine (e.g., the stator winding) are known to have a certain transfer characteristic in respect of transmission of impulse signals from one end of the coil, or somewhere within the coil, to the other end of the coil, where the PD sensors are located. In a rough approximation and in terms of impulse voltage, the transfer characteristic from one end of the coil to another end of the coil can resemble a transfer characteristic of a higher order low pass with a corner frequency at about 1 megahertz (MHz). In other words, a discharge source located in proximity of the PD sensor can produce pulses at the PD sensor having a wider frequency spectrum than pulses of sources located farther inside the coil. Thus, spatially separated pulse sources may produce pulses with different spectra when analyzed in the frequency domain. In further embodiments of the disclosure, this physical fact can be used for further differentiating Phiqn patterns and differentiating PD-processes with sources at different locations.

Existing partial-discharge pulse-receiver (PDPR) instruments typically sample the voltage signals at three or more inputs with a sampling rate much higher than the corner frequency of about 1 MHz. Typically, a PDPR instrument can be configured to sample the voltage signals at a speed of about 100 million samples per second (MS/s) or above, per input channel. At this speed and simultaneous sampling at the input channels, the PDPR instrument converts the voltage signals into their digital representation.

Using an appropriate digital filtering (for example, digital band passes), the pulse receiver can be configured to receive the same pulses in different frequency bands and perform evaluations in a multi-band receiving mode. In certain embodiments of the disclosure, the lowest band may span from about 100 kilohertz to 1 MHz, the second band from about 1 MHz to 2 MHz, the third band from about 2 MHz to 3 MHz, the fourth band from about 3 MHz to 4 MHz, and the last band from about 4 MHz to 5 MHz. Thus, the pulse receiver can be configured to receive simultaneously five reception frequency bands or "channels" with a stop-band level of, for example, about −40 decibels (dB).

In accordance with some embodiments of the disclosure, each channel may produce its own stream of pulses. Each discharge pulse in the coil winding may be represented in 5 reception channels, producing up to 5 detected pulses occurring approximately at the same time. Some of the pulses may be too small in a higher reception frequency band, so the pulse-detection instrument may not detect them.

In some embodiments of the disclosure, phase-resolved Phiqn-array scan be collected as described above using the 5 streams of pulses. The Phiqn-arrays can cover the same periods of time across the 5 channels. Each Phiqn-array from one channel can be obtained simultaneously with counterpart Phiqn-arrays from the other channels. This approach may result in sequences of Phiqn-arrays and their image representations for each of the 5 channels. Each of the sequences of Phiqn-arrays can be further analyzed in the way described above using basic shapes and learning processes through the sequence of Phiqn-arrays.

Additionally, in some embodiments of the disclosure, the Phiqn-patterns in simultaneously obtained counterpart Phiqn-arrays corresponding to different frequency bands can be compared to each other to support identification and differentiation of PD processes, the Phiqn-patterns, and the intensity of the discharge of the PD processes.

A PD process, located somewhere along the winding within the machine, may produce a certain sequence of discharge pulses in accordance with a discharge mechanism of the PD source. The same sequence of pulses may appear in all frequency bands. However, the detected peak values (pulse heights) of pulses may differ in the different frequency bands. PD images can be generated using the sequences of pulses as described above. Phiqn-patterns, recognized in the PD images, may originate from the same discharge source. Because the Phiqn-patterns are simultaneously acquired in different frequency bands, the Phiqn-patterns may differ from each other, mostly in the pulse height axis (Y-axis). However, the overall graphical structure of the Phiqn-patterns obtained in different frequency ranges can remain substantially the same. Therefore, the Phiqn-patterns can be identified using the same basic shapes. Phiqn-patterns originating from source locations close to the PD sensors may have very similar heights in all frequency bands, because the original PD pulses have a very wide spectrum. Phiqn-patterns originating from source locations far away from the PD sensors may have diverging pulse heights in different frequency bands because of the filter effect of the long winding.

Furthermore, as signals from disturbance-sources and interference sources are also quite limited in their high-frequency content, fewer disturbances may appear in the higher frequency channel Phiqn-arrays. Phiqn-patterns may be more clearly visible in higher frequency bands than in the lower frequency band. However, the real pulse height, that indicates the discharge intensity of the corresponding source, can be attenuated in the higher frequency ranges and measured in the lowest frequency range. In some embodiments of the disclosure, to overcome this measurement problem, a Phiqn-pattern can be identified in the lowest frequency range using the Phiqn-pattern identified in a higher frequency counterpart Phiqn-array by comparison with the higher frequency counterpart Phiqn-array in terms of a phase location and a basic shape. After identification of the Phiqn-pattern in the lowest frequency band, the discharge intensity associated with the Phiqn-pattern can also be calculated in the lowest frequency band. In some embodiments, the identification of the Phiqn-pattern can also be carried in the higher frequency bands by comparison to basic shapes and by evaluation of the historic sequences of Phiqn-arrays as described above.

In some embodiments of the disclosure, a whole set of individual pulse characteristics can be pulse-filtered, instead of splitting up the whole input signal, using band pass filters. The pulse characteristics may include slope steepness, oscillatory activity (ringing), burst decay, and so forth. These embodiments may utilize the fact that a certain discharge source at a certain location may produce a sequence of discharge pulses, which may have substantially the same characteristics different from the characteristics of the pulses of other discharge sources and from noise sources. The input signal can be sampled with a high sampling rate (for example, about 100 million samples per second). Pulses can be further detected in the stream of sampled data. The pulses can be further categorized (or filtered) according to pulse criteria to generate different streams or sets of categorized pulses. Sets of Phiqn-arrays can be generated as described above using sets of categorized pulses. Different sets of Phiqn-arrays can contain different Phiqn-patterns. The Phiqn-patterns can be identified using comparison to basic shapes and evaluation of sequences of historic Phiqn-arrays as described above. Furthermore, intensities of the different identified Phiqn-patterns can be calculated. Trends can be generated using the intensities of different PD sources over time.

Figure 5:
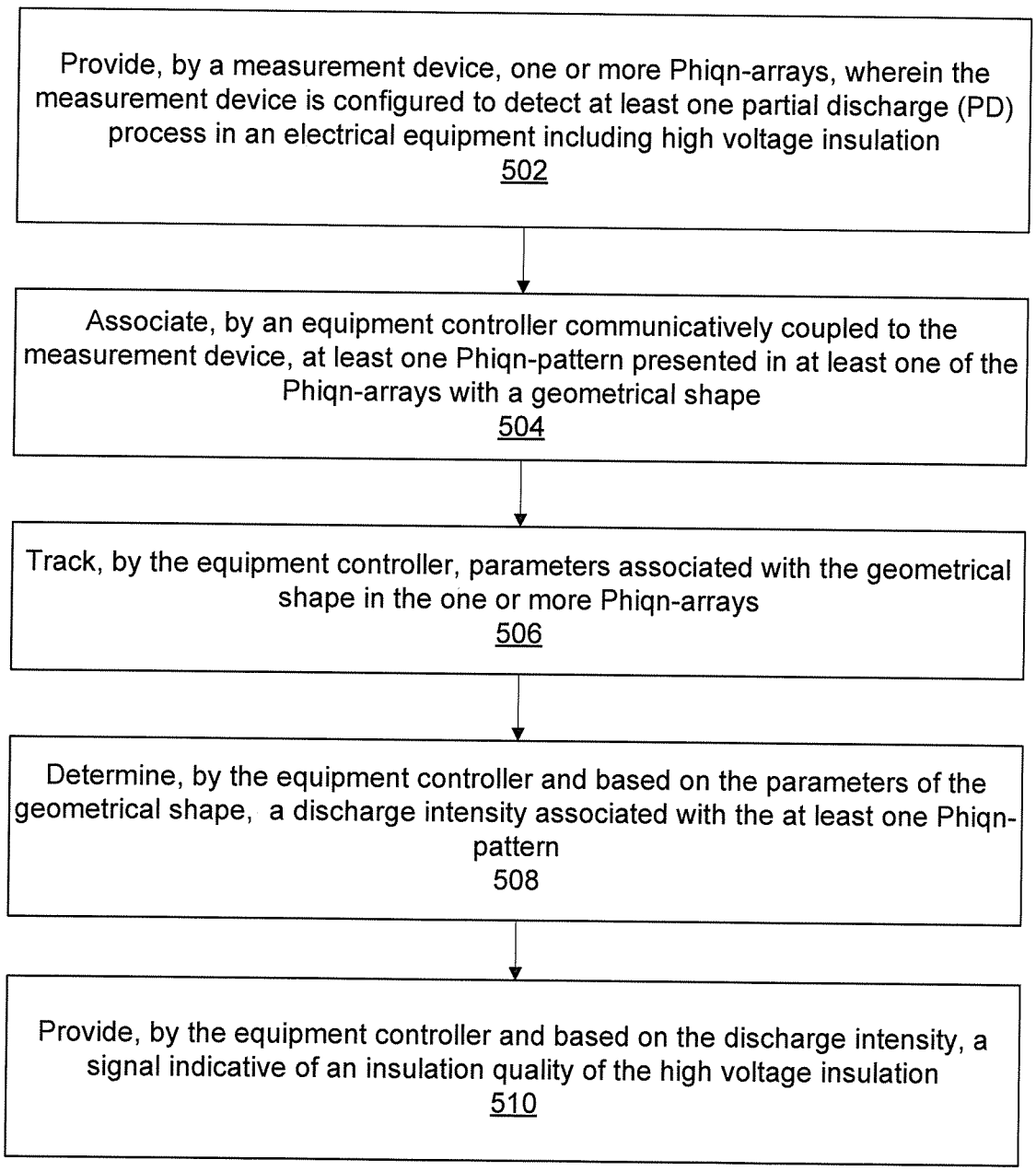
FIG. 5 is a flow chart illustrating a method for evaluation of a phase-resolved partial discharge, according to an embodiment of the disclosure.

FIG. 5 is flow chart illustrating an example method 500 for evaluation of a phase-resolved partial discharge, according to example embodiments of the disclosure. The operations of the method 500 can be performed by components of the system 100 described above with reference to FIG. 1.

The method 500 may commence in block 502 with providing, by a measurement device, one or more Phiqn-arrays. The measurement device can be configured to detect at least one PD process in a high voltage insulation of an electrical equipment. In block 504, the method 500 may proceed with associating, with a geometrical shape, by an equipment controller communicatively coupled to the measurement device, at least one Phiqn-pattern present in the one or more Phiqn-arrays. In block 506, the method 500 may track, by the equipment controller, parameters associated with the geometrical shape in the Phiqn-arrays. In block 508, the method 500 may allow determining, by the equipment controller and based on the parameters of the geometrical shape, a discharge intensity associated with the Phiqn-pattern. In block 510, method 500 may provide, by the equipment controller and based on the discharge intensity, a signal indicative of an insulation quality of the high voltage insulation. In certain embodiments of the disclosure, the signal may include an alert or a warning concerning the quality of the high voltage insulation.

Figure 6:
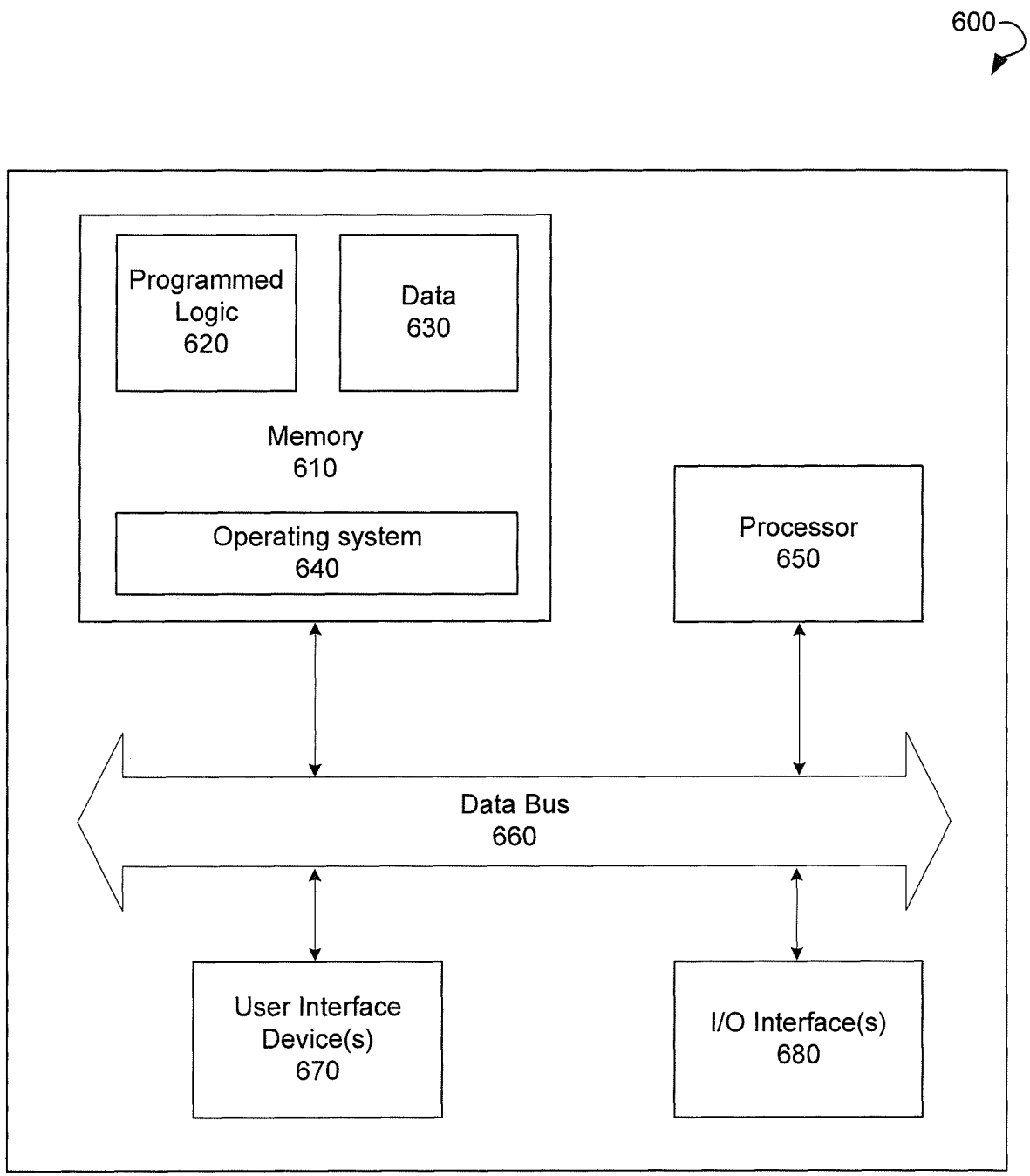
FIG. 6 is a block diagram illustrating a controller for evaluation of a phase-resolved partial discharge, in accordance with an embodiment of the disclosure.

FIG. 6 depicts a block diagram illustrating an example controller 600, in accordance with an embodiment of the disclosure. More specifically, the elements of the controller 600 may be used to analyze vibrational data of rotating equipment. The controller 600 may include a non-transitory memory 610 that stores programmed logic 620 (e.g., software) and may store data 630, such as operational data associated with the PD evaluation system 100, the set of constants, and the like. The memory 610 also may include an operating system 640.

A processor 650 may utilize the operating system 640 to execute the programmed logic 620, and in doing so, may also utilize the data 630. A data bus 660 may provide communication between the memory 610 and the processor 650. Users may interface with the controller 600 via at least one user interface device 670, such as a keyboard, mouse, control panel, or any other device capable of communicating data to and from the controller 600. The controller 600 may be in communication with the partial discharge device 125 while operating, via an input/output (I/O) interface 680. Additionally, it should be appreciated that other external devices or other rotating equipment may be in communication with the controller 600 via the I/O interface 680. In the illustrated embodiment of the disclosure, the controller 600 may be located remotely with respect to the PD evaluation system 100; however, it may be co-located or even integrated with the PD evaluation system 100. Further, the controller 600 and the programmed logic 620 implemented thereby may include software, hardware, firmware, or any combination thereof. It should also be appreciated that multiple controllers 600 may be used, whereby different features described herein may be executed on one or more different controllers 600.

References are made to block diagrams of systems, methods, apparatuses, and computer program products, according to example embodiments of the disclosure. It will be understood that at least some of the blocks of the block diagrams, and combinations of blocks in the block diagrams, may be implemented at least partially by computer program instructions. These computer program instructions may be loaded onto a general purpose computer, special purpose computer, special purpose hardware-based computer, or other programmable data processing apparatus to produce a machine, such that the instructions which execute on the computer or other programmable data processing apparatus create means for implementing the functionality of at least some of the blocks of the block diagrams, or combinations of blocks in the block diagrams discussed.

These computer program instructions may also be stored in a computer-readable memory that can direct a computer or other programmable data processing apparatus to function in a particular manner, such that the instructions stored in the computer-readable memory produce an article of manufacture including instruction means that implement the function specified in the block or blocks. The computer program instructions may also be loaded onto a computer or other programmable data processing apparatus to cause a series of operations and/or acts to be performed on the computer or other programmable apparatus to produce a computer implemented process such that the instructions that execute on the computer or other programmable apparatus provide operations and/or actions for implementing the functions specified in the block or blocks.

One or more components of the systems and one or more elements of the methods described herein may be implemented through an application program running on an operating system of a computer. They also may be practiced with other computer system configurations, including handheld devices, multiprocessor systems, microprocessor based or programmable consumer electronics, mini-computers, mainframe computers, and the like.

Application programs that are components of the systems and methods described herein may include routines, programs, components, data structures, and so forth that implement certain abstract data types and perform certain tasks or actions. In a distributed computing environment, the application program (in whole or in part) may be located in local memory or in other storage. In addition, or alternatively, the application program (in whole or in part) may be located in remote memory or in storage to allow for circumstances where tasks are performed by remote processing devices linked through a communications network.

The above detailed description includes references to the accompanying drawings, which form part of the detailed description. The drawings depict illustrations, in accordance with example embodiments. These example embodiments, which are also referred to herein as "examples," are described in enough detail to enable those skilled in the art to practice the present subject matter. The example embodiments may be combined, other embodiments may be utilized, or structural, logical, and electrical changes may be made, without departing from the scope of the claimed subject matter. The above detailed description is, therefore, not to be taken in a limiting sense, and the scope is defined by the appended claims and their equivalents.

Many modifications and other embodiments of the example descriptions set forth herein to which these descriptions pertain will come to mind having the benefit of the teachings presented in the foregoing descriptions and the associated drawings. Thus, it will be appreciated that the disclosure may be embodied in many forms and should not be limited to the example embodiments described above.

Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system for evaluation of a phase-resolved partial discharge (PD), the system comprising:
 a measurement device configured to detect at least one PD process in a high voltage insulation of an electrical equipment and provide a plurality of Phiqn-arrays; and
 an equipment controller communicatively coupled to the measurement device, the equipment controller being configured to:
  associate, with a geometrical shape, at least one Phiqn-pattern present in at least one of the plurality of Phiqn-arrays;
  quantify characteristic values of the geometric shape, wherein the characteristic values comprise at least one of: pulse repetition rate, an average discharge current, and a quadratic discharge rate;
  track ambient parameters associated with the geometrical shape in the plurality of PD images, wherein the ambient parameters comprise coil temperatures, gas pressure and temperature, and gas humidity;

determine, based on the geometrical shape, a discharge intensity associated with the at least one Phiqn-pattern;

determine, based on the ambient parameters associated with the geometrical shape and characteristic values of the geometric shape, a trend in occurrences of PD discharges; and provide, based on the discharge intensity and trend, a signal indicative of an insulation quality of the high voltage insulation.

2. The system of claim 1, wherein the equipment controller configured to associate the at least one Phiqn-pattern with a geometrical shape is further configured to determine a type, a location, and dimensions of the geometrical shape to fit the Phiqn-pattern.

3. The system of claim 2, wherein the equipment controller configured to track parameters of the geometrical shape is further configured to track changes in the location and the dimensions of the geometrical shape.

4. The system of claim 1, wherein the geometrical shape is associated with a type of the PD process.

5. The system of claim 1, wherein the equipment controller configured to associate, with a geometrical shape, at least one Phiqn-pattern is further configured to select the geometrical shape from a list including at least one of the following: a triangle, a horizontal rectangle, a vertical rectangle, and an oval.

6. The system of claim 1, wherein the equipment controller configured to determine the discharge intensity, is further configured to determine the discharge intensity based on high-frequency pulses located within the geometrical shape associated to the at least one Phiqn-pattern.

7. The system of claim 1, wherein the equipment controller configured to associate the at least one Phiqn-pattern with the geometrical shape, is further configured to utilize a learning algorithm to associate the at least one Phiqn-pattern with the geometrical shape, wherein the learning algorithm is trained with historical Phiqn-arrays and previous Phiqn-patterns identified in the historical Phiqn-arrays.

8. The system of claim 1, wherein the equipment controller is further configured to determine, based on the discharge intensity, a rate of deterioration of the high voltage insulation.

9. The system of claim 1, wherein the equipment controller configured to provide the signal indicative of a condition of the high voltage insulation is further configured to:

correlate parameters of the geometrical shape to at least one of changes in operational parameters of the electrical equipment or changes in ambient conditions; and modify, based on the correlation, the signal indicative of the insulation quality of the high voltage insulation.

10. The system of claim 9, wherein the equipment controller is further configured to:

determine, based on at least one of operational parameters of the electrical equipment or ambient conditions, a threshold for the discharge intensity;

determine that the discharge intensity exceeds the threshold; and based on the determination, selectively provide an alert concerning the insulation quality.

11. A method for evaluation of a phase-resolved partial discharge (PD), the method comprising:

providing, by a measurement device, one or more Phiqn-arrays, wherein the measurement device is configured to detect at least one partial discharge (PD) process in an electrical equipment including a high voltage insulation;

associating with a geometrical shape, by an equipment controller communicatively coupled to the measurement device, at least one Phiqn-pattern present in the one or more Phiqn-arrays;

quantifying characteristic values of the geometric shape, wherein the characteristic values comprise at least one of: pulse repetition rate, an average discharge current, and a quadratic discharge rate;

tracking, by the equipment controller, ambient parameters associated with the geometrical shape in the one or more Phiqn-arrays, wherein the ambient parameters comprise coil temperatures, gas pressure and temperature, and gas humidity;

determining, by the equipment controller and based on the geometrical shape, a discharge intensity associated with the at least one Phiqn-pattern;

determine, based on the ambient parameters associated with the geometrical shape and characteristic values of the geometric shape, a trend in occurrences of PD discharges; and providing, by the equipment controller and based on the discharge intensity and trend, a signal indicative of an insulation quality of the high voltage insulation.

12. The method of claim 11, wherein:

associating with a geometrical shape at least one Phiqn-pattern includes determining a type, a location, and dimensions of the geometrical shape to fit the Phiqn-pattern; and tracking the parameters associated with the geometrical shape includes tracking changes in the location and the dimensions of the geometrical shape.

13. The method of claim 11, further comprising determining, based on the discharge intensity, a rate of deterioration of the high voltage insulation.

14. The method of claim 11, wherein the geometrical shape is associated with at least one type of the PD process.

15. The method of claim 11, wherein the geometrical shape is selected from a list including at least one of the following: a triangle, a horizontal rectangle, a vertical rectangle, and an oval.

16. The method of claim 11, wherein determining the discharge intensity is based on high-frequency pulses located within the geometrical shape associated with Phiqn-pattern.

17. The method of claim 11, wherein the at least one Phiqn pattern is associated with the geometrical shape based on utilizing a learning algorithm, the learning algorithm being trained with historical Phiqn-arrays and previous Phiqn-patterns identified within the historical Phiqn-arrays.

18. The method of claim 11, further comprising:

correlating, by the equipment controller, the changes in the geometrical shape to at least one of the changes in operational parameters of the electrical equipment or changes in ambient conditions; and modifying, by the equipment controller and based on the correlation, the signal indicative of the insulation quality of the high voltage insulation.

19. The method of claim 18, wherein the method further comprises:

determining, by the equipment controller and based on at least one of the changes in operational parameters of the electrical equipment or the changes in ambient conditions, a threshold for the discharge intensity;

determining, by the equipment controller, that the discharge intensity exceeds the threshold; and based on the results of the determination, selectively providing, by the equipment controller, an alert concerning the insulation quality.

20. A system for evaluation of phase-resolved partial discharge (PD), the system comprising:

an electrical equipment including a high voltage insulation;

a measurement device configured to detect at least one PD process in the high voltage insulation and provide a series of Phiqn-arrays; and an equipment controller communicatively coupled to the measurement device, the equipment controller being configured to:

associate at least one Phiqn-pattern present in at least one of the Phiqn-arrays with a geometrical shape, wherein the geometrical shape is associated with a type of partial discharge process, wherein a type, location, and dimension of the geometrical shape is selected to fit to the at least one Phiqn-pattern;

quantify characteristic values of the geometric shape, wherein the characteristic values comprise at least one of: pulse repetition rate, an average discharge current, and a quadratic discharge rate;

track ambient parameters associated with the geometrical shape in the series of the Phiqn-arrays by tracking changes in the location and the dimension of the geometrical shape, wherein the ambient parameters comprise coil temperatures, gas pressure and temperature, and gas humidity;

determine, based on the geometrical shape, a discharge intensity associated with the at least one Phiqn-pattern, wherein the discharge intensity is based on pulses found within the geometrical shape;

determine, based on the ambient parameters associated with the geometrical shape and characteristic values of the geometric shape, a trend in occurrences of PD discharges;

determine, based on the discharge intensity, a rate of deterioration of the high voltage insulation;

generate, based on the discharge intensity and trend, a signal indicative of an insulation quality of the high voltage insulation;

correlate the changes in parameters of the geometrical shape to at least one of changes in operational parameters of the electrical equipment or changes in ambient conditions;

modify, based on the correlation, the signal indicative of the insulation quality of the high voltage insulation;

determine, based on the operational parameters of the electrical equipment, a threshold for the discharge intensity;

determine that the discharge intensity exceeds the threshold; and based on the results of the determination that the discharge intensity exceeds the threshold, provide a signal concerning a quality of the high voltage insulation.

* * * * *